(12) United States Patent
Brist et al.

(10) Patent No.: US 7,145,243 B2
(45) Date of Patent: Dec. 5, 2006

(54) PHOTO-THERMAL INDUCED DIFFUSION

(75) Inventors: Gary A. Brist, Yamhill, OR (US); Gary B. Long, Aloha, OR (US); Daryl A. Sato, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 10/616,748

(22) Filed: Jul. 9, 2003

(65) Prior Publication Data

US 2004/0058521 A1    Mar. 25, 2004

Related U.S. Application Data

(62) Division of application No. 10/252,304, filed on Sep. 23, 2002, now Pat. No. 6,642,158.

(51) Int. Cl.
*H01L 21/348* (2006.01)
*H01L 23/52* (2006.01)
*H01L 29/40* (2006.01)

(52) U.S. Cl. ............ 257/762; 257/692; 257/693; 257/738; 257/737; 257/E21.584; 257/E23.148; 257/E21.347; 427/553; 427/554; 427/555; 427/402; 428/644; 428/646; 428/647; 428/614

(58) Field of Classification Search ............ 428/646, 428/626, 647, 929, 644, 675, 614; 438/795, 438/613, 614, 975, 658, 660; 257/780, 758, 257/E21.588, E21.347, 692, 693, 762–766, 257/770, 773; 427/508, 553, 402, 555
See application file for complete search history.

(56) References Cited

U.S. PATENT DOCUMENTS

| | | | | |
|---|---|---|---|---|
| 4,049,481 A | * | 9/1977 | Morisaki | ............... 156/151 |
| 4,457,950 A | | 7/1984 | Fujita et al. | |
| 4,895,099 A | * | 1/1990 | D'Amato | ..................... 118/58 |
| 4,925,522 A | | 5/1990 | Avellino et al. | |
| 4,983,250 A | | 1/1991 | Pan | |
| 5,088,087 A | * | 2/1992 | Paquin | ..................... 369/283 |
| 5,230,965 A | * | 7/1993 | Cole et al. | ................. 428/601 |
| 5,248,527 A | * | 9/1993 | Uchida et al. | ............. 427/437 |
| 5,264,108 A | * | 11/1993 | Mayer et al. | .............. 205/125 |
| 5,821,627 A | * | 10/1998 | Mori et al. | ................ 257/780 |
| 5,926,942 A | * | 7/1999 | Kubo et al. | ................... 29/599 |
| 6,124,205 A | * | 9/2000 | Doan | ........................ 438/688 |
| 6,251,529 B1 | * | 6/2001 | Kubo | ........................ 428/619 |
| 6,486,553 B1 | | 11/2002 | Tazikawa et al. | |

(Continued)

FOREIGN PATENT DOCUMENTS

JP    2000021546 A  *  1/2000

(Continued)

OTHER PUBLICATIONS

International Search Report PCT/US 03/28926.

(Continued)

*Primary Examiner*—B. William Baumeister
*Assistant Examiner*—Igwe U. Anya
(74) *Attorney, Agent, or Firm*—Blakely, Sokoloff, Taylor & Zafman LLP (57) ABSTRACT

Formation of a mixed-material composition through diffusion using photo-thermal energy. The diffusion may be used to create electrically conductive traces. The diffusion may take place between material layers on one of a package substrate, semiconductor substrate, substrate for a printed circuit board (PCB), or other multi-layered substrate. The photo-thermal energy may be supplied by various devices, for example a YAG laser device, $CO_2$ laser device, or other energy source.

6 Claims, 7 Drawing Sheets

U.S. PATENT DOCUMENTS 6,717,266 B1 *  4/2004  Marathe et al. ............. 257/751
6,727,593 B1 *  4/2004  Toyoda et al. .............. 257/762
7,025,906 B1 *  4/2006  Shimizu et al. ............. 252/512

FOREIGN PATENT DOCUMENTS

WO   WO 02 63394 A   8/2002
WO   WO 03 102262 A  12/2003

OTHER PUBLICATIONS

PCT Written Opinion.

* cited by examiner

PHOTO-THERMAL INDUCED DIFFUSION

This is a Divisional Application of Ser. No.: 10/252,304 filed Sep. 23, 2002, now U.S. Pat. No. 6,642,158.

BACKGROUND

1. Technical Field

An embodiment of the invention relates to semiconductor package and printed circuit board (PCB) manufacturing, and in particular relates to diffusion of a portion of one material into another.

2. Description of the Related Art

In the fabrication of integrated circuits, semiconductor wafers are processed and sliced into dice. Each die may then be mounted to a supporting structure such as a packaged substrate and/or a PCB for use in an electronic device. Forming the dice generally involves depositing layers of varying purposes. For example, an inter-layer dielectric (ILD) may be deposited and patterned to hold and electrically isolate conductive circuit features. The circuitry of the die includes layers of such features.

Once the die is formed, it is packaged. The packaging process may include connecting the die to a protective package substrate, which in turn may be connected directly to the PCB. The package substrate may include bond pads which are coupled to an array of metal bumps or other conductive features of the compact die. The bond pads are in turn coupled to the internal circuitry of the package substrate. In this manner, the larger package substrate may act as an electronic interface to fan out electronic paths between the compact internal circuitry of the die and the much larger PCB.

Similar to die formation, package substrate and PCB processing may include forming the above-indicated circuitry of the package substrate. Such circuitry may include multiple layers of circuit features. Similar to die circuit features, package substrate circuit features may include metal traces isolated within an interlayer dielectric layer (ILD) or metal traces on the package/PCB surface. In order to form layers of circuitry in the package substrate, a time consuming multi-step process, which may include one or more processes of metal deposition, photolithographic patterning and developing, and etching is generally employed as described below.

Initially, a dielectric core material having one or more metal layers for a package substrate may be provided having a protective coating thereon. The protective coating may be an organic material to prevent oxidation of the metal layer or a second metal layer covering some or all of the primary metal layer prior to processing. The composite core and metal layers may undergo initial processing, such as via formation prior to the formation of circuitry or addition of layers of dielectric and/or circuitry. The protective coating may then be mechanically or chemically removed, followed by deposition of dielectric material layers to support circuitry as noted above.

Metal traces or other circuit features may be patterned into, and isolated by, the dielectric material. This may be achieved by photolithographic patterning and developing. First, a resist layer is placed above the dielectric material. The resist layer may be of photosensitive material that undergoes a photomasking operation. The photomasking operation delivers a pattern of light energy (such as ultraviolet light) to the resist layer, which is then developed to selectively remove portions of the resist in accordance with the exposure pattern. Subsequently, an etchant chemical may be delivered to the package substrate, etching trenches into the dielectric material at locations where it is not protected by the resist material (i.e. where the resist has been removed by the photomasking operation). This may be followed by metalization, wherein metal lines or other circuit features are formed in the trenches.

Unfortunately, a high cost is incurred and throughput is limited by the time consuming process described above. Furthermore, material expenses are incurred by the need for a host of materials, such as those indicated above, in order to form even a single metal circuit feature of a single circuit layer.

BRIEF DESCRIPTION OF THE DRAWINGS

The invention may be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

Methods of diffusing a portion of a first material into a second material are described. Aspects of embodiments are described and illustrated by the accompanying drawings. While the following embodiments are described with reference to a particular method of forming metal traces in a package substrate, the embodiments may be applicable to any diffusion or doping of one material into another. This may include any method of photo-thermal induced diffusion for processing a package or semiconductor substrate.

Figure 1:
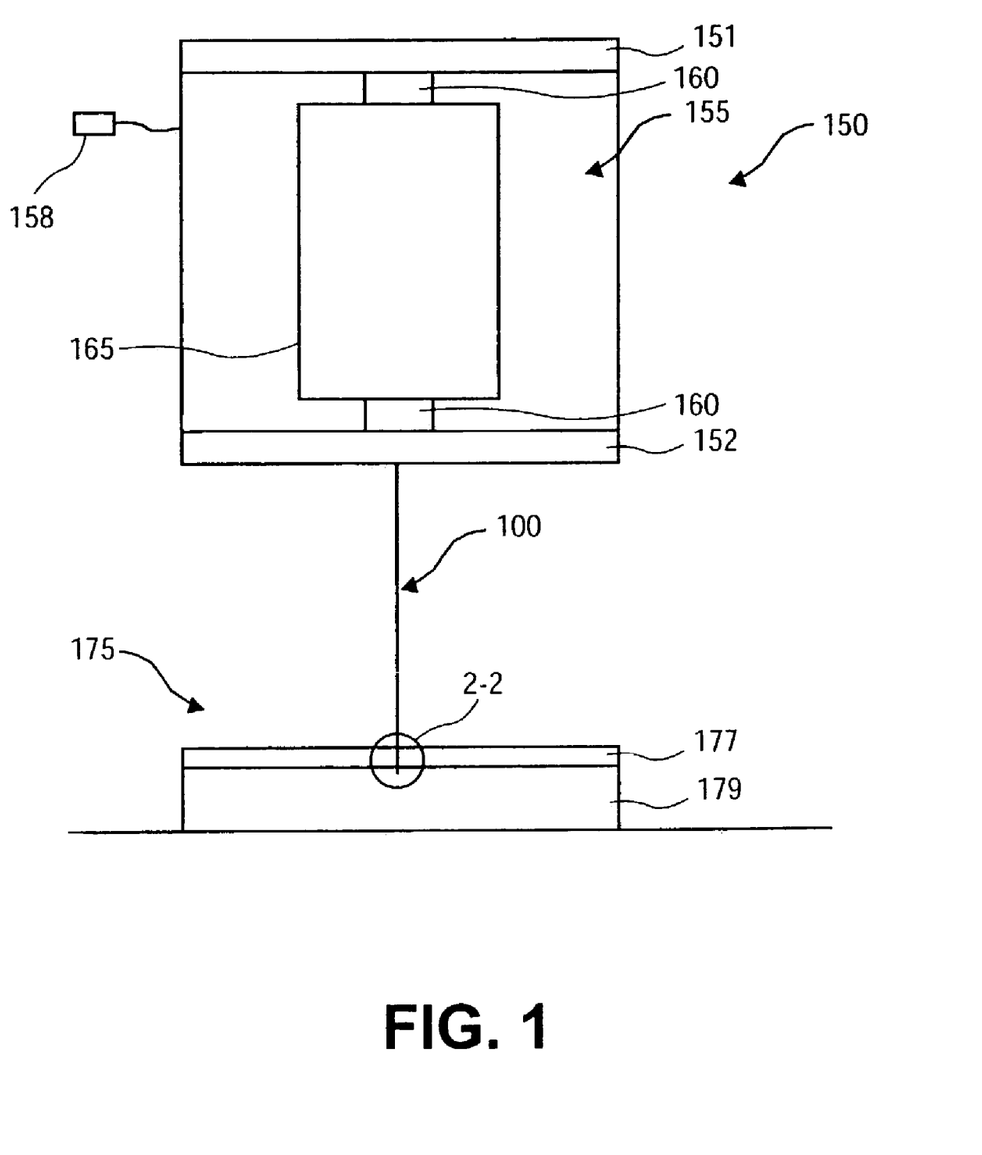
FIG. 1 is a side sectional view of a photo-thermal apparatus directing a photo-thermal energy to a substrate including a first material adjacent a second material, according to one embodiment of the invention.

Referring now to FIG. 1, a photo-thermal apparatus is shown in the form of a laser device 150, for example a yttrium aluminum garnate (YAG) laser device. The laser device 150 includes a total reflection mirror 151 and a partial reflection mirror 152 with a laser cavity 155 therebetween. An amplifying medium 165 is positioned in the laser cavity 155.

A power source 158 is coupled to the laser device 150 to power a light source to repeatedly direct internal light 160 through the amplifying medium 165 as described further below. The amplifying medium 165 includes a rod of yttrium aluminum garnate providing ions of lanthanide metal neodymium. The internal light 160 is energized and reenergized by the amplifying medium 165 as it repeatedly passes therethrough. As the internal light 160 encounters the total reflection mirror 151 it is reflected back through the amplifying medium 165 and toward the partial reflection mirror 152. Most of the internal light 160 is also reflected by the partial reflection mirror 152 back through the amplifying medium 165. However, a small portion (e.g., between about 1% and about 3%) of the internal light 160 passes beyond the partial reflection mirror 152 in the form of a laser light 100.

The laser light 100 shown in FIG. 1 is directed at a substrate 175 which includes a first material 177 adjacent a second material 179. The materials 177, 179 may be in the form of layers of the substrate 175. As the laser light 100 encounters the substrate 175 a portion of the first material 177 is diffused into the second material 179 by the thermal energy imparted by the laser light 100.

In one embodiment the substrate 175 is a package substrate to accommodate a semiconductor die. Examples of such embodiments are described further herein with reference to FIGS. 3A–5. Additionally, however, any substrate including a first material 177 adjacent a second material 179 may be subjected to a laser light 100 or other form of photo-thermal energy for diffusion of a portion of the first material 177 into the second material 179. This may include semiconductor substrates and substrates for printed circuit boards (PCBs).

Figure 2:
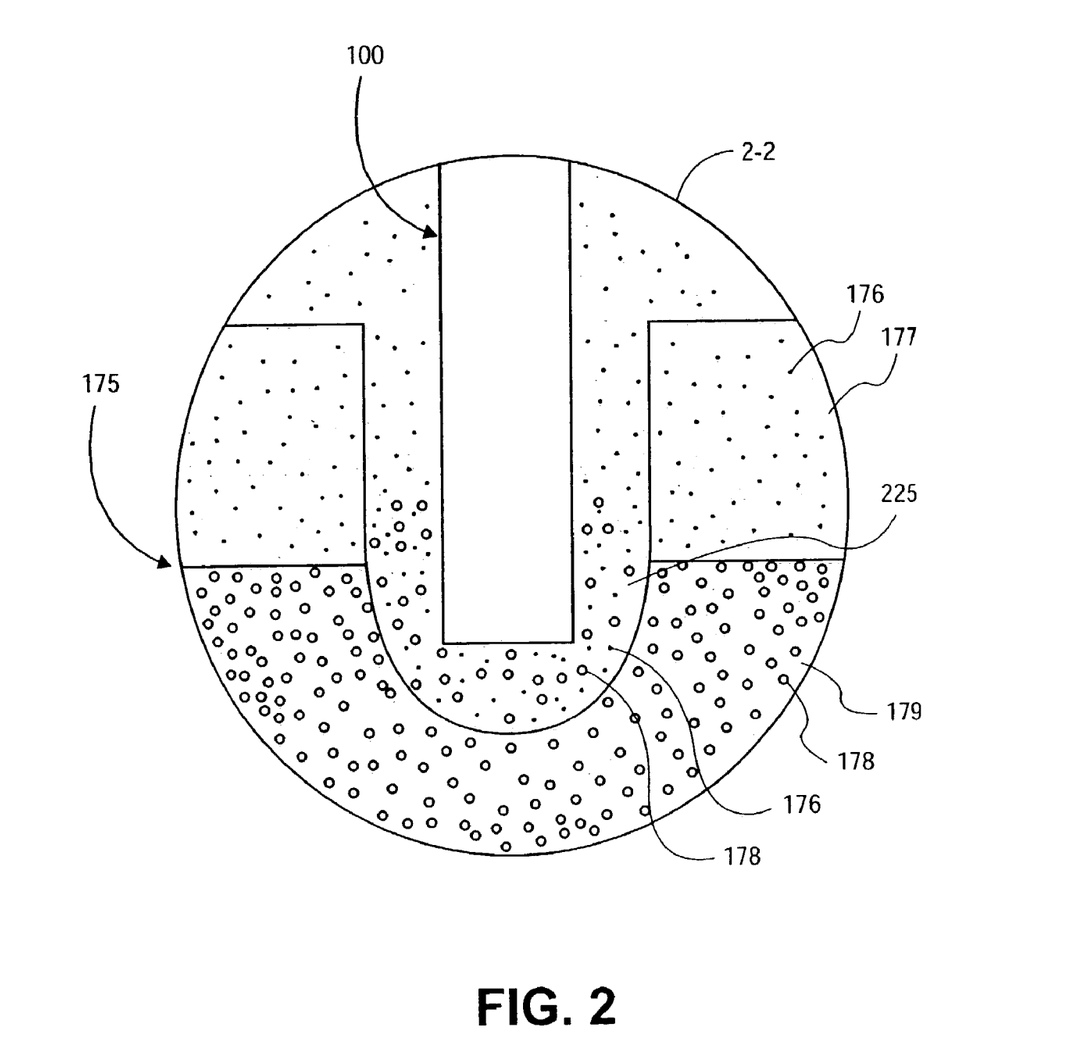
FIG. 2 is an enlarged view of a portion of FIG. 1, according to one embodiment of the invention.

Referring to FIG. 2, an enlarged view of section 2—2 taken from FIG. 1 is shown. The laser light 100 can be seen penetrating the first material 177 of the substrate 175. In the embodiment shown, the laser light 100 actually penetrates the substrate 175 to a point beyond the first material 177. However, this is not required to achieve diffusion into the second material 179 as described below. This is because heat from the laser light 100 will penetrate beyond the terminating point of the laser light 100. Although the terminating point is shown as a sharp cut-off in FIG. 2 for simplicity of illustration, the terminating point of laser light 100 may actually be a gradual reduction of intensity as the laser light 100 is absorbed into the material.

As the laser light 100 heats the substrate 175 a portion of the first material 177 is diffused into the second material 179 to form a combined material portion 225 of the substrate 175. Depending on the thermal energy delivered, at least a portion of the first material 177 may ablate into a gaseous or plasma state, with the resulting high energy particles causing diffusion to take place. In one embodiment where the materials 177, 179 are different metals, the combined material portion 225 may be an alloy made up of the different materials 177, 179. As shown in FIG. 2, some of the first particles 176 of the first material 177 can be seen in the combined material portion 225 along with second particles 178 of the second material 179. As also shown in FIG. 2, the combined material portion 225 may extend above the second material 179.

With reference to FIGS. 1 and 2, the formation of a combined material portion 225 by diffusion of a portion of a first material 177 into a second material 179 with a photo-thermal source of energy, such as a laser light 100, is shown. A wide range of parameters are available to choose from in forming such a combined material portion 225. For example, a variety of choices are available regarding the size, type, strength, and duration of the photo-thermal source of energy, as well the forms and types of materials 177, 179 and substrates 175. With reference to FIGS. 3A–3D particular embodiments of forming combined material portions in the form of metal traces 325 for a package substrate 375 are described. However, as noted above, other applications may employ embodiments of the described diffusion techniques. Additionally, the selective diffusion described may be used to configure a combined material portion 225 having particular electrical, mechanical or chemical properties. One such example is described below with reference to FIGS. 3A–5.

Referring now to FIGS. 3A–3D, an embodiment of a package substrate 375 is shown where metal traces 325 are formed. The package substrate 375 may be for a semiconductor package, such as the semiconductor package 500 shown in FIG. 5. The package substrate 375 may include a core 376 made up of various materials, such as ceramic, fiber-reinforced epoxy, copper clad, etc.

Figure 3A:
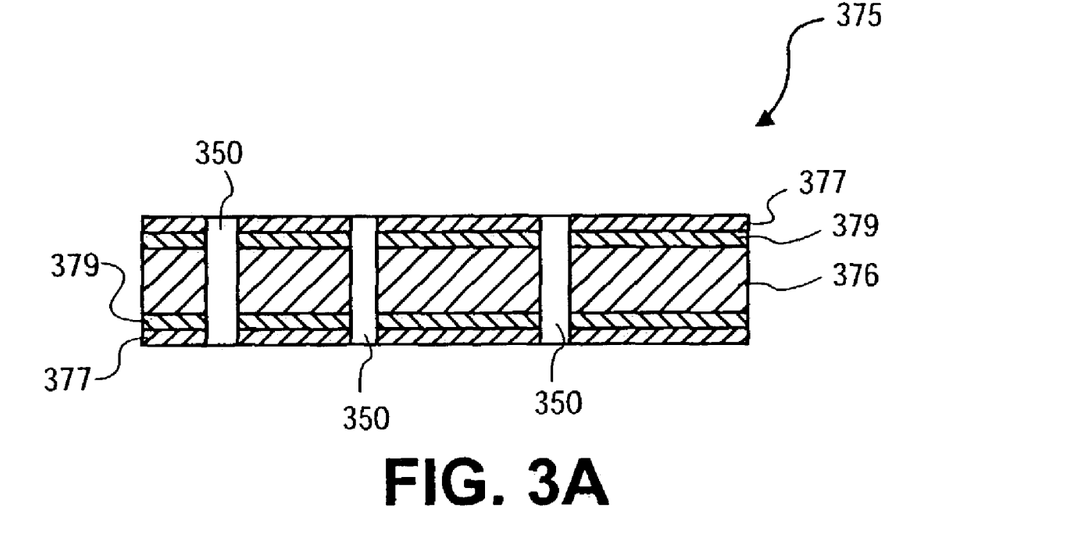
FIGS. 3A–3D are side cross-sectional views of a package substrate at various fabrication stages, according to one embodiment of the invention.
Figure 6:
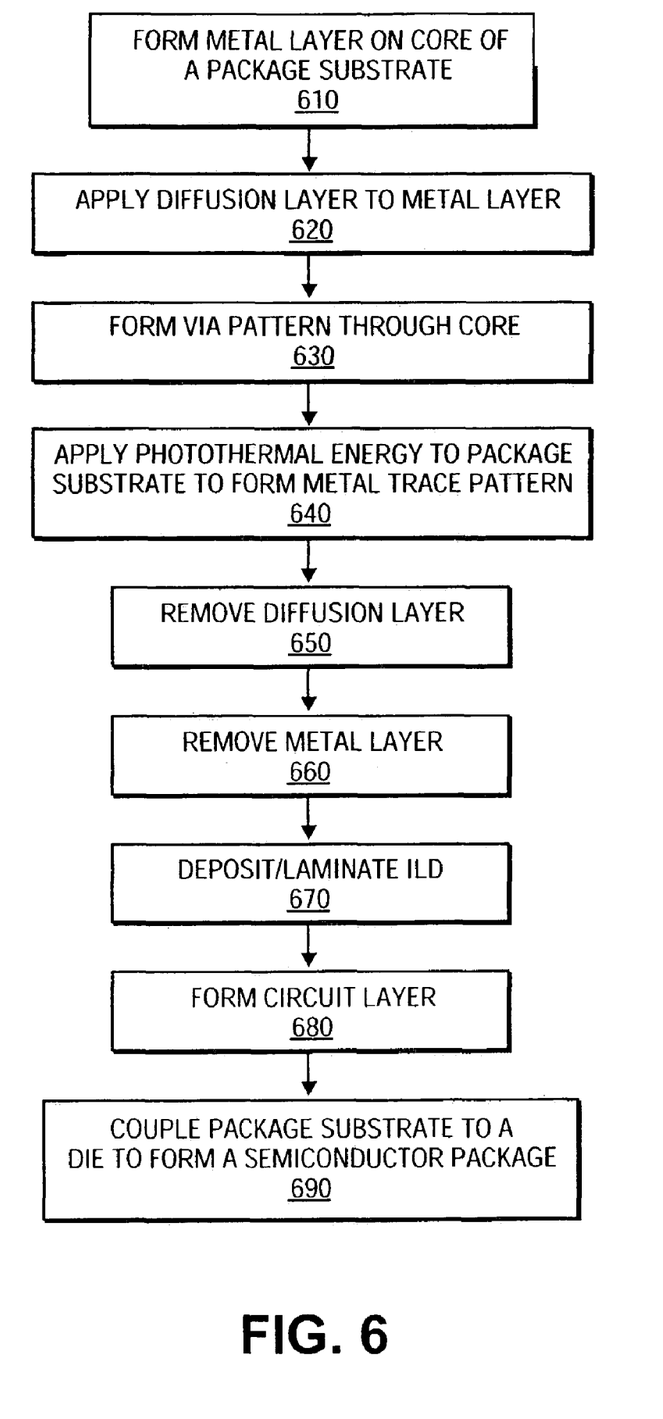
FIG. 6 is a flow chart of a method, according to one embodiment of the invention.

As described below, and with reference to FIG. 6, metal layers 379 may be initially formed on the core 376 as shown at block 610. FIG. 6 is a flow-chart summarizing embodiments of forming package substrates and semiconductor packages employing metal traces formed by photo-thermal induced diffusion. FIG. 6 is referenced throughout the remainder of the description as an aid in explaining these embodiments.

The metal layers 379 noted above may be formed on the core 376 by known or yet-to-be developed metalization techniques, such as electroplating or plasma enhanced chemical vapor deposition (PECVD).

The metal layer 379 deposited may be of a metal chosen to form the desired type of metal traces 325. For example, in an embodiment where the metal traces 325 are to be copper based, the metal layer 379 may be of copper. In one embodiment, the metal layer 379 may be between about 5 and about 20 microns in thickness, but other thicknesses may also be used.

Continuing with reference to FIG. 3A, a diffusion layer 377 is shown above the metal layer 379. The diffusion layer 377 includes a material selected for diffusion into the metal layer 379. For example, the diffusion layer 377 may include tin for diffusion into the metal layer 379 to form copper tin metal traces 325.

The diffusion layer 377 may also include materials selected to protect the metal layer 379. For example, in one embodiment, the diffusion layer 377 may act as a conversion coating to prevent oxidation of the underlying metal layer 379. In one embodiment the conversion coating material may be a conventional organic material commonly used to form surface coatings, but other materials may also be used. For example, the diffusion layer 377 may include a polymer epoxy, possibly with added nitrogen or elements from the bromine groups. Additionally, the diffusion layer may be an organic metal, such as a polymer with tin side groups, as tin may bond with carbon. Alternatively, in another embodiment, tin may be independently dispersed within the organic material of the diffusion layer 377. Such organic materials generally form an adequate sealant to prevent oxidation as indicated.

As indicated at block 620 of FIG. 6, the diffusion layer 377 may be applied to the metal layer 379 by various means, such as in liquid form by syringe delivery with subsequent drying. Additionally, the diffusion layer 377 may be between about 0.01 and about 0.50 microns. As described further below, the thickness of the diffusion layer 377 may be determined based on the amount of material to be diffused into the metal layer 379 in forming the metal traces 325.

Continuing with reference to FIG. 3A, vias 350 are shown formed in the package substrate 375, as referenced at block 630 of FIG. 6. Vias 350 allow for the formation of interconnecting electrical paths across the core 376 such that metal traces on both sides of package substrate 375 may be connected to each other. The vias 350 may be formed by any feasible means, such as laser drilling, machine punching, etc. The particular placement and configuration of the vias 350 is a matter of design choice depending upon the circuit design to be employed by the package substrate 375.

Figure 3B:
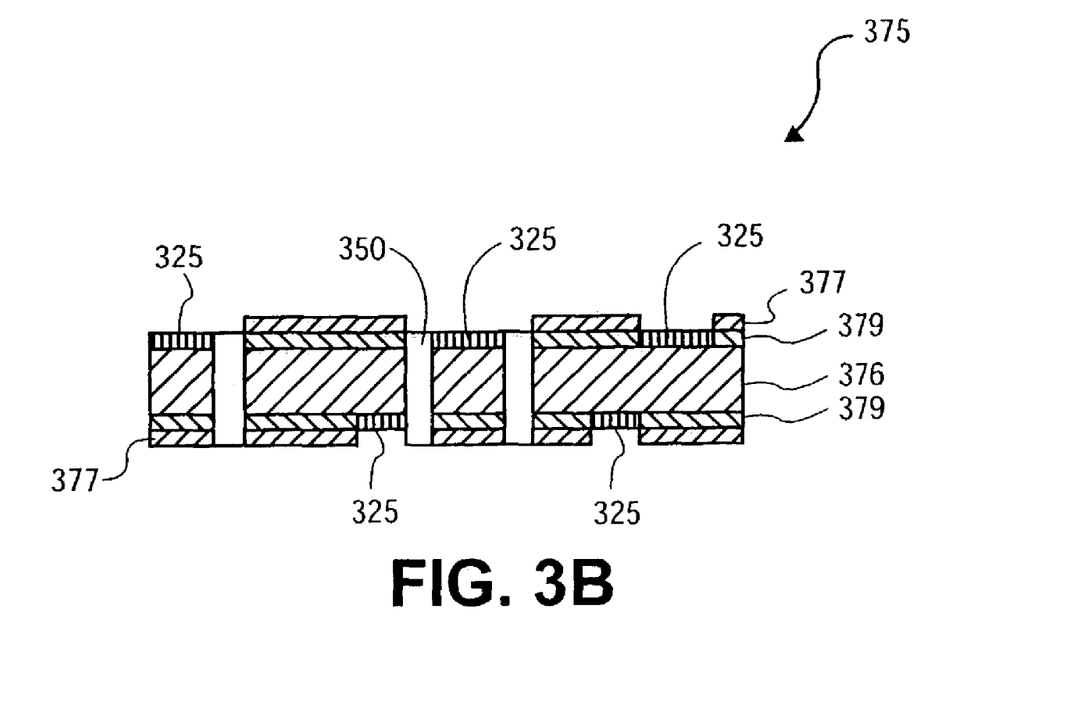

Referring to FIG. 3B, the package substrate of FIG. 3A is shown with a pattern of metal traces 325. As described further here, the metal traces 325 may be formed in the manner that the combined material portions 225 of FIG. 2 are formed. That is, as shown at block 640 of FIG. 6, a photo-thermal energy is applied to at least the diffusion layer 377 at the locations of the metal traces 325 to diffuse material from the diffusion layer 377 into the metal layer 379, forming the metal traces 325 thereat. The metal traces 325 are of a particular alloy as described below. The alloy may be configured to be of particular chemical, electrical, and mechanical properties.

In one embodiment a laser device is employed similar to that described with reference to FIGS. 1 and 2. The laser device directs a laser at the diffusion layer 377 in locations where the metal traces 325 are to be formed. In one embodiment, a width of the laser beam is between about 2 mils and about 8 mils. However, the particular size of the laser bean used is a matter of design choice. In fact, most of the particular parameters of the laser will be a matter of design choice depending on a number of factors.

A variety of parameters may be considered during application of the laser as indicated above. For example, the size of the laser beam applied may depend upon, for example, the width of the metal traces 325 to be formed. Additionally, the laser may be applied for a time sufficient to fully diffuse portions of the diffusion layer 377 at the locations of the metal traces 325 into the metal layer 379. However, this amount of time is a matter of design choice depending upon, for example, the thickness of the diffusion layer 377 at these locations and the strength of the laser selected. Additionally, to ensure that metal traces 325 do not exceed an intended size, the laser may be applied for a set time at each location, regardless of any remaining portions of the diffusion layer 377 thereat.

In one embodiment, application of the laser to the package substrate 375 as described results in the diffusion of tin into the copper metal layer 375 forming metal traces 325 of a copper tin alloy. That is, the laser heats the diffusion layer 377 and at least a portion of the metal layer 379. The diffusion layer 377 is broken up in a manner that allows diffusion of tin into the heated portion of the metal layer 379. In another embodiment, where the diffusion layer 377 is a polymer, diffusion of elements or compounds such as oxygen, nitrogen, bromine into the metal layer 379 occurs as the diffusion layer is broken up or ablated. At the same time, depending on the particular make-up of the diffusion layer 377, other materials such as oxygen, carbon dioxide, nitrogen and/or other gases may be formed and may dissipate away from the forming metal traces 325 of the package substrate 375.

Although the diffusion layer described above is deposited specifically to provide diffusion material, the diffusion layer may serve multiple purposes. For example, in one embodiment a soldermask layer is used to provide the diffusion material.

As described above, the metal traces 325 are formed by application of a photo-thermal energy in the form of a laser as provided by a laser device. However, other forms of photo-thermal energy may be used to direct a portion of the diffusion layer 377 into the metal layer 379 to form metal traces 325. For example, a $CO_2$ or infrared laser device may be employed to diffuse a portion of the diffusion layer 377 into the metal layer.

The particular pattern of metal traces 325 formed is again a matter of design choice. As with the placement and configuration of vias 350 described above, the pattern of metal traces 325 depends upon the overall circuit design to be displayed by the package substrate 375. As described above, the metal traces 325 may be formed by diffusion as directed by a laser device. Therefore, the laser device may be programmed to direct a laser to pattern the metal traces 325 in accordance with the circuit design of the package substrate 375.

Figure 3C:
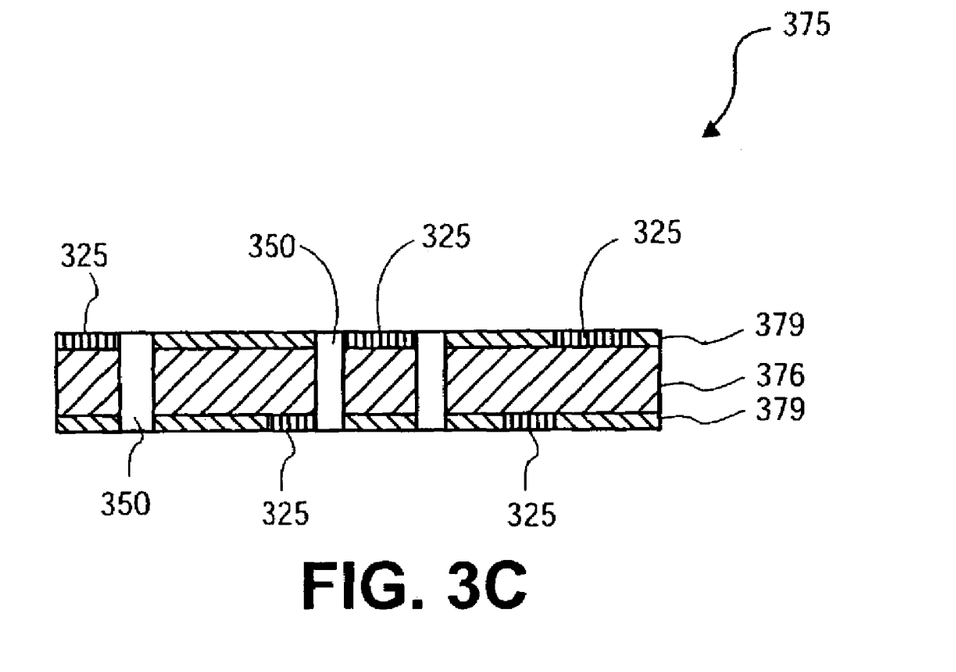

Continuing with reference to FIGS. 3B and 3C, along with FIG. 6, the remainder of the diffusion layer 377 may removed as shown at block 680, once the metal traces 325 are formed. Removal of the diffusion layer 377 may be achieved by application of etching or removal means particularly configured to remove materials of the diffusion layer 377. For example, in the embodiment described above, the diffusion layer 377 may be of an epoxy polymer having elements of tin incorporated therein, and the epoxy polymer may be removed using chemical mechanical processing (CMP). In one embodiment, sodium hydroxide and/or alkaline strippers may be used to remove the polymer. Additionally, such a stripper may be combined with an oxidizing fluoride solution to ensure removal of any excess tin of the diffusion layer 377. Once the diffusion layer 377 is removed, the package substrate 375 may be washed with a rinse or acid neutralizing solution to remove any excess solvents.

Figure 3D:
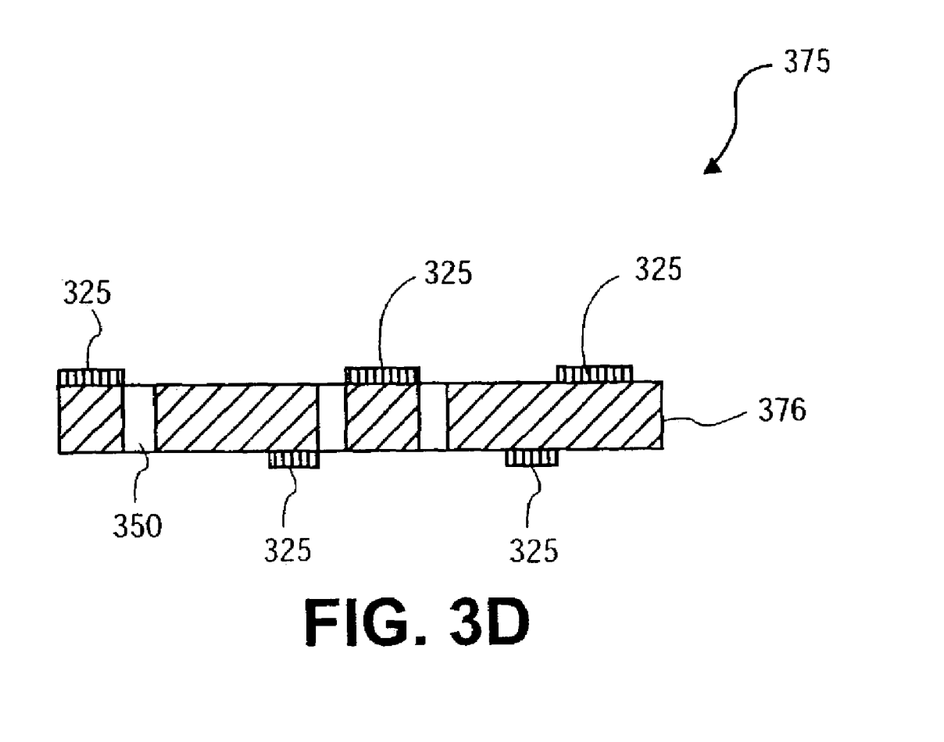

Referring to FIGS. 3C and 3D, along with FIG. 6, the non-diffused portions of the metal layer 379 may be removed as shown at block 660. In an embodiment in which the metal layer 379 is of copper, a removal chemistry including cupric chloride may be used to remove the remaining portions of the metal layer 379, leaving the substrate 375 with metal traces 325 of a copper tin alloy as shown in FIG. 3D. Once the metal layer 379 is completely removed, the package substrate 375 may again be washed with a rinse or acid neutralizing solution to remove any excess cupric chloride.

In the above examples, the diffusion layer 377 and metal layer 379 are removed with removal chemistries which may have a minimal effect on the metal traces 325. For example, cupric chloride, while removing the metal layer 379, may also dissolve some of the alloy of the metal trace 325, but at only about 20–30% the dissolution rate of the metal layer 379. Therefore, in an embodiment where metal traces 325 are to have a thickness between about 10–15 microns and a width between about 20–30 microns, the metal traces 325 may actually be formed about 20–30% larger prior to removal of the diffusion 377 and metal 379 layers. For example, in such an embodiment, the metal traces 325 may be originally formed as indicated above with a thickness between 13–20 microns and a width between about 27–35 microns.

Continuing with reference to FIG. 3D, once metal traces 325 have been patterned above the core 376 as shown, subsequent processing my provide by various means. For example, the vias 350 may be filled with a conventional polymer epoxy material and repunched to accommodate interconnect features. That is, following formation of a new via lined with epoxy, interconnect material such as copper may be deposited/plated therein by various means. Additionally, inter-layer dielectric (ILD) material may be deposited/laminated between and onto the metal traces 325 as shown at block 670 of FIG. 6. Other circuit features and layers may also be provided above the metal traces 325 by various means, as shown in FIG. 4.

Figure 4:
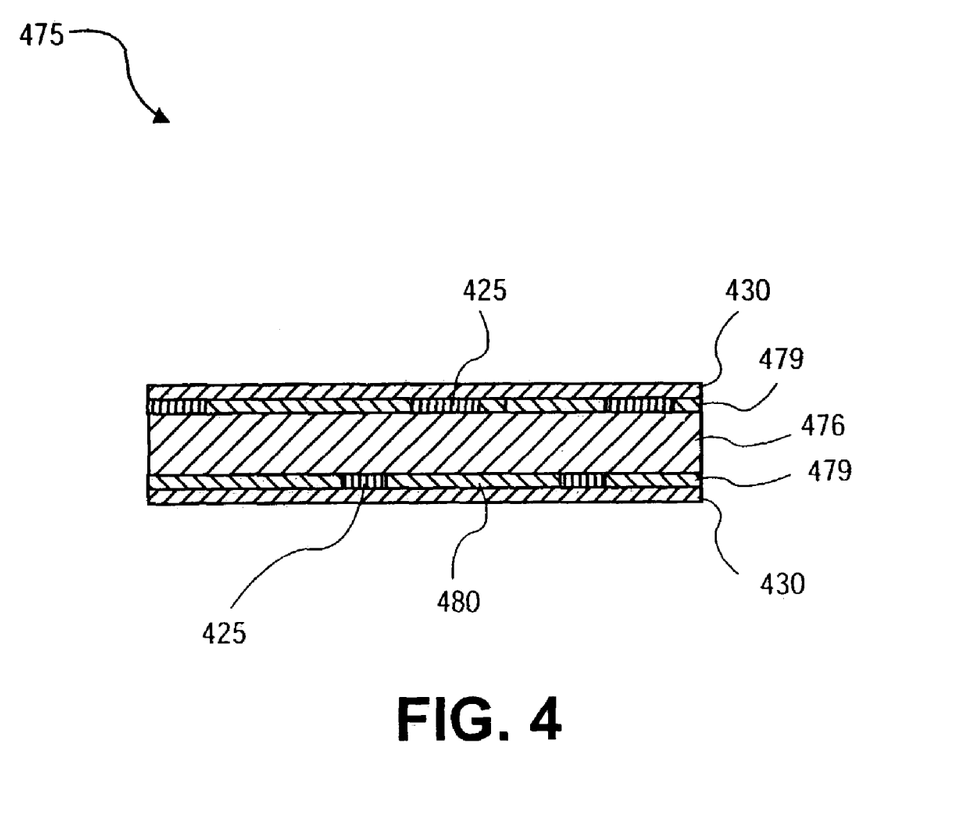
FIG. 4 is a side cross sectional view of another package substrate, according to one embodiment of the invention.

Referring to FIG. 4, a package substrate 475 formed according to the methods described above with reference to FIGS. 3A–3D is shown. In particular, a core 476 is shown accommodating metal trace layers 479 with metal traces 425 isolated by ILD material 480. Once the metal trace layers 479 are complete, they may be planarized by various techniques, for example CMP, to leave surfaces of the metal traces 425 exposed for electrical connection to subsequently deposited circuit layers 430. The circuit layers 430 formed as indicated at block 680 of FIG. 6, may be of multi-layered circuitry having various circuit features. The particular configuration of each circuit layer 430 may be a matter of design choice. In one embodiment electrical contacts are formed on the surface of circuit layer 430 for electrical connection to another device.

For package and PCB applications, the dielectric materials 480 and/or 430 may be placed and bonded via a lamination cycle and the metal deposited by various techniques, for example electroplating or electroless plating.

Figure 5:
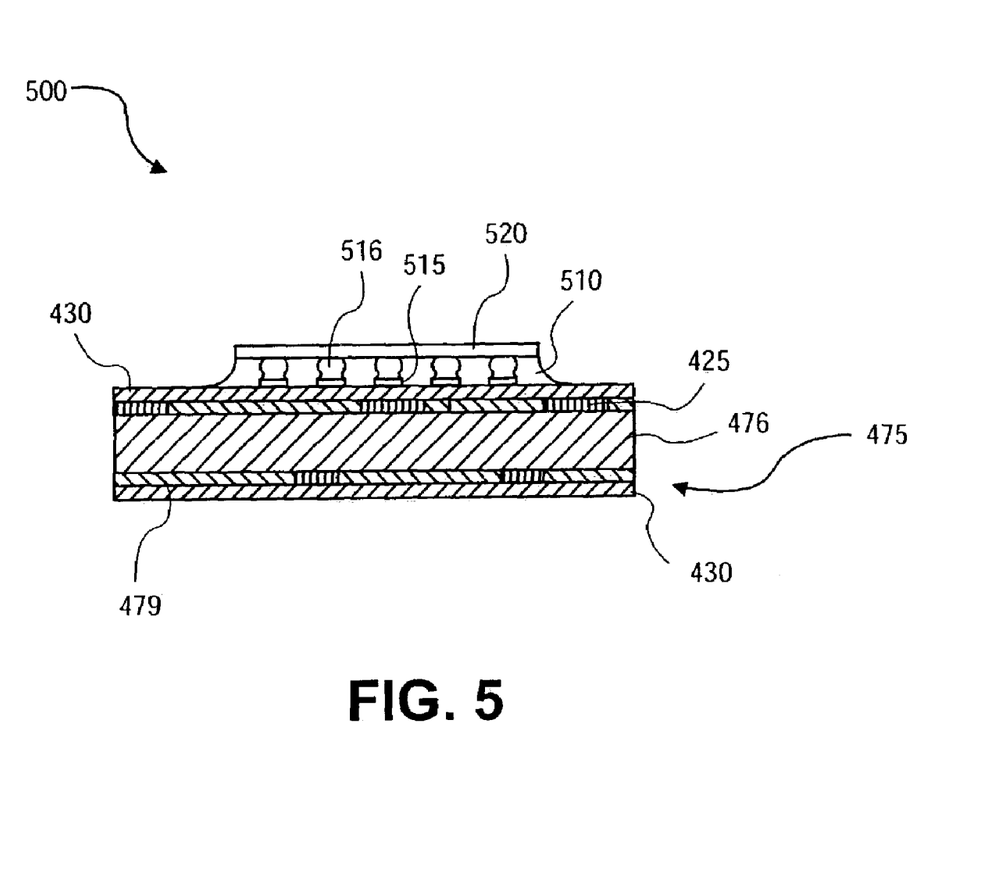
FIG. 5 is a side cross sectional view of a semiconductor package utilizing the package substrate of FIG. 4, according to one embodiment of the invention.

Referring to FIG. 5, the package substrate 475 of FIG. 4 is shown as part of a completed semiconductor package 500. In the embodiment shown, bond pads 515 are shown electrically coupled to a circuit layer 430 and to metal bumps 516 of a die 520. The die 520 may be secured to the package substrate 475 by an adhesive underfill material 510. Soldering techniques may be employed to couple the bond pads 515 to the circuit layer 430 and metal bumps 516. Similarly, reflow techniques may be used to cure the underfill material 510 and couple the die 510 to the package substrate 475 as indicated at block 690 of FIG. 6 to complete the semiconductor package 500.

Forming metal traces as indicated above increases throughput and may eliminate the need for a time-consuming photolithographic process. Additionally, material expenses may be reduced as the formation of purely sacrificial layers of a substrate may be avoided. Furthermore, with respect to package substrates, the diffusion layer may be a conversion coating to prevent oxidation, as is often provided on package substrates, but having incorporated therein additional material for diffusion into an underlying material.

Embodiments described above include methods of inducing diffusion of one material into another by photo-thermal induction. Additionally, embodiments include reference to particular circuit features such as metal traces. Although exemplary embodiments describe particular methods of photo-thermal diffusion regarding package substrates, additional embodiments are possible. For example, techniques described may be applied to substrates for PCBs, or to other multilayered substrates. Additionally, diffusion into a material may be achieved by melting a portion of a metal in foil form above the material by a photo-thermal energy source. Furthermore, many changes, modifications, and substitutions may be made without departing from the spirit and scope of these embodiments.

We claim:

1. An apparatus, comprising:
an electrically conductive trace on a substrate, the electrically conductive trace including an alloy of first and second materials, the alloy formed by applying a laser beam to the first material disposed on the second material; and diffusing a portion of the first material into a portion of the second material responsive to said applying, and wherein the first material includes a polymer epoxy.

2. The apparatus of claim 1, wherein:
the substrate is part of one of a semiconductor package, a printed circuit board, or a die.

3. The apparatus of claim 1, wherein:
the second material includes metal.

4. The apparatus of claim 1, wherein:
the second material includes copper.

5. The apparatus of claim 1, wherein:
the first material includes tin.

6. The apparatus of claim 1, wherein the polymer epoxy comprises at least one of nitrogen or bromine.

* * * * *